US009935648B1

(12) United States Patent
Kamble et al.

(10) Patent No.: US 9,935,648 B1
(45) Date of Patent: Apr. 3, 2018

(54) REDUCING REFERENCE CHARGE CONSUMPTION IN ANALOG-TO-DIGITAL CONVERTERS

(71) Applicant: Analog Devices Global, Hamilton (BM)

(72) Inventors: Maitrey Kamble, Mumbai (IN); Arvind Madan, Bangalore (IN); Sandeep Monangi, Srikakulam (IN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/692,695

(22) Filed: Aug. 31, 2017

Related U.S. Application Data

(60) Provisional application No. 62/417,508, filed on Nov. 4, 2016.

(51) Int. Cl.
    *H03M 1/46*      (2006.01)
    *H03M 1/80*      (2006.01)

(52) U.S. Cl.
    CPC .......... *H03M 1/466* (2013.01); *H03M 1/462* (2013.01); *H03M 1/804* (2013.01)

(58) Field of Classification Search
None
See application file for complete search history.

(56) References Cited

U.S. PATENT DOCUMENTS

| 7,532,146 | B2 * | 5/2009 | Jeon | H03M 1/0682 341/155 |
|---|---|---|---|---|
| 7,705,755 | B2 | 4/2010 | Yang et al. | |
| 7,965,218 | B2 | 6/2011 | Ohnhaeuser et al. | |
| 8,537,045 | B2 * | 9/2013 | Kapusta | H03M 1/0845 341/144 |
| 9,716,513 | B1 | 7/2017 | Chen et al. | |
| 2011/0032134 | A1 | 2/2011 | Cho et al. | |
| 2017/0033800 | A1 * | 2/2017 | Yuan | H03M 1/1245 |
| 2017/0317683 | A1 * | 11/2017 | Bandyopadhyay ... | H03M 1/002 |

OTHER PUBLICATIONS

"U.S. Appl. No. 15/227,687, Amendment Under 37 C.F.R.§ 1.312 filed Jun. 9, 2017", 8 pgs.

(Continued)

*Primary Examiner* — Howard Williams
(74) *Attorney, Agent, or Firm* — Schwegman Lundberg & Woessner, P.A.

(57) ABSTRACT

To reduce the overall reference charge needed to perform operations, analog-to-digital converters can maintain reference voltage connections of the bit trial capacitors of the digital-to-analog converter (DAC) from the end of a current conversion to just prior to the beginning of the next acquisition phase. At the start of the next acquisition phase, the bottom plates of the bit trial capacitors of the DAC can be shorted to generate a common mode voltage. As the conversion phase begins, the bottom plates of the sampling capacitors are disconnected from the input voltage and the bottom plates of each bit trial capacitor are shorted to generate input common-mode voltage. As bit trials progress, the shorts between the bottom plates of the bit trial capacitors are removed and the bit trial results are applied to the bottom plates of the bit trial capacitors.

22 Claims, 5 Drawing Sheets

(56) References Cited

OTHER PUBLICATIONS

"U.S. Appl. No. 15/227,687, Examiner Interview Summary dated Jan. 26, 2017", 3 pgs.
"U.S. Appl. No. 15/227,687, Non Final Office Action dated Oct. 14, 2016", 9 pgs.
"U.S. Appl. No. 15/227,687, Notice of Allowance dated Mar. 17, 2017", 5 pgs.
"U.S. Appl. No. 15/227,687, PTO Response to Rule 312 Communication dated Jun. 22, 2017", 2 pgs.
"U.S. Appl. No. 15/227,687, Response filed Jan. 19, 2017 to Non Final Office Action dated Oct. 14, 2016", 13 pgs.
Chen, Yanfei, et al., "A 9b 100MS/s 1.46mW SAR ADC in 65nm CMOS", IEEE Asian Solid-State Circuits Conference, (Nov. 18, 2009), 145-148.
Liou, Chang-Yuan, et al., "A 2.4-to-5.21J/conversion-step 10b 0.5-to-4MS/s SAR ADC with Charge-Average Switching DAC in 90nm CMOS", ISSCC, Session 15, Data Converter Techniques 15.7, (Feb. 19, 2013), 3 pgs.
Zhu, Yan, et al., "A 10-bit 100-MS/s Reference-Free SAR ADC in 90 nm CMOS", IEEE Journal of Solid-State Circuits, vol. 45, No. 6, (Jun. 2010), 11 pgs.

\* cited by examiner

US 9,935,648 B1

REDUCING REFERENCE CHARGE CONSUMPTION IN ANALOG-TO-DIGITAL CONVERTERS

CLAIM OF PRIORITY

This application claims the benefit of priority of U.S. Provisional Patent Application Ser. No. 62/417,508, titled "REDUCING REFERENCE CHARGE CONSUMPTION IN ANALOG-TO-DIGITAL CONVERTERS" to Maitrey Kamble et al., filed on Nov. 4, 2016, the entire contents of which being incorporated herein by reference.

FIELD OF THE DISCLOSURE

This document pertains generally, but not by way of limitation, to integrated circuits, and more particularly, to Analog-to-Digital Converter (ADC) circuits.

BACKGROUND

An analog-to-digital converter (ADC) circuit can be used to convert an analog signal to a digital signal, which can then be further processed or used in the digital domain. A Successive Approximation Register (SAR) ADC circuit can carry out bit trials to compare portions of the analog signal to a reference voltage to determine the digital bit values of a digital word representing a particular sample of the analog signal. A SAR ADC can use a capacitor array of a Digital-to-Analog Converter (DAC) for carrying out the bit trials for determining the respective digital bit values of the digital word.

SUMMARY OF THE DISCLOSURE

A SAR ADC converts input voltage into a digital code by successively comparing the sampled input charge with different amounts of reference charge. The reference charge needed for these comparisons can be provided by an on-chip/off-chip reference buffer along with a large off-chip decoupling capacitor, e.g., order of 10 microfarads (μF). A consideration is ensuring that the reference value remains relatively stable while the ADC continues to draw reference charge from the decoupling capacitor during a given conversion. The reference buffer, therefore, charges the off-chip capacitor back to reference by the time next conversion starts.

The present inventors have recognized, among other things that charging the reference capacitor(s) can cause significant reference current. As the reference charge consumed in bit-trials is reduced, the ringing of reference voltage due to bond-wire inductance can be reduced. Also, reducing the variation of reference current with respect to the input can help relax the reference buffer specifications. This disclosure presents techniques to reduce the amount of reference current. For example, this disclosure describes using the results of a previous conversion to reduce the reference current in the current conversion. Doing so can significantly reduce the overall reference charge needed by the ADC, e.g., reference charge in a conversion phase as well as in an acquisition phase. Reducing the overall charge needed can allow an integrated circuit to operate at reduced power consumption, particularly for battery-powered applications.

In an aspect, this disclosure is directed to method of operating an analog-to-digital converter (ADC) integrated circuit device for reducing an amount of reference charge drawn during operation. The method comprises sampling an input voltage; performing at least one bit trial using first and second digital-to-analog converter circuits (DACs), the first and second DACs each having multiple capacitor elements, each element having a first plate and a second plate and corresponding to a digital bit position; when the at least one bit trial is completed, loading a result of the at least one bit trial on the second plate of at least one element in the first DAC and on the second plate of at least one corresponding digital bit position element in the second DAC; maintaining a result of the at least one bit trial on the second plate of at least one element in the first DAC and on the second plate of at least one corresponding digital bit position element in the second DAC until a subsequent acquisition phase begins; and prior to beginning the subsequent acquisition phase, forming an electrical connection from the second plate of the at least one element in the first DAC to the second plate of the at least one corresponding digital bit position element in the second DAC to form at least one corresponding common mode voltage having a value of an average of a voltage on the second plate of the at least one element in the first DAC and a voltage on the second plate of the at least one corresponding digital bit position element in the second DAC.

In an aspect, this disclosure is directed to an analog-to-digital converter (ADC) circuit for reducing an amount of reference charge drawn during operation. The circuit comprises a first digital-to-analog converter circuit (DAC) configured to sample an input voltage, the first DAC circuit having multiple capacitor elements, each element having a first plate and a second plate and corresponding to a digital bit position; a second DAC circuit configured to sample the input voltage, the second DAC circuit having multiple elements, each element having a first plate and a second plate and corresponding to a digital bit position; and control circuitry. The control circuitry is configured to: perform at least one bit trial using the first and second DACs; when the at least one bit trial is completed, load a result of the at least one bit trial on the second plate of at least one element in the first DAC and on the second plate of at least one corresponding digital bit position element in the second DAC; maintain a result of the at least one bit trial on the second plate of at least one element in the first DAC and on the second plate of at least one corresponding digital bit position element in the second DAC until a subsequent acquisition phase begins; and prior to beginning the subsequent acquisition phase, form an electrical connection from the second plate of the at least one element in the first DAC to the second plate of the at least one corresponding digital bit position element in the second DAC to form at least one corresponding common mode voltage having a value of an average of a voltage on the second plate of the at least one element in the first DAC and a voltage on the second plate of the at least one corresponding digital bit position element in the second DAC.

In an aspect, this disclosure is directed to an integrated circuit device comprising a successive approximation register (SAR) analog-to-digital converter (ADC) circuit for reducing an amount of reference charge drawn during an analog-to-digital conversion. The SAR ADC circuit comprises a first digital-to-analog converter circuit (DAC) configured to sample an input voltage, the first DAC circuit having multiple capacitor elements, each element having a first plate and a second plate and corresponding to a digital bit position; a second DAC circuit configured to sample the input voltage, the second DAC circuit having multiple elements, each element having a first plate and a second plate and corresponding to a digital bit position; and control circuitry. The control circuitry is configured to perform at least one bit trial using the first and second DACs; when the at least one bit trial is completed, load a result of the at least one bit trial on the second plate of at least one element in the first DAC and on the second plate of at least one corresponding digital bit position element in the second DAC; maintain a result of the at least one bit trial on the second plate of at least one element in the first DAC and on the second plate of at least one corresponding digital bit position element in the second DAC until a subsequent acquisition phase begins; and prior to beginning the subsequent acquisition phase, form an electrical connection from the second plate of the at least one element in the first DAC to the second plate of the at least one corresponding digital bit position element in the second DAC to form at least one corresponding common mode voltage having a value of an average of a voltage on the second plate of the at least one element in the first DAC and a voltage on the second plate of the at least one corresponding digital bit position element in the second DAC.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This disclosure describes, among other things, techniques to reduce the amount of reference current drawn by an ADC, e.g., in a conversion phase as well as in an acquisition phase. The reference charge drawn can be thought of as a sum of average reference charge and input-dependent reference charge. The drop in the reference value during a conversion phase ($\Delta V_{REF}$) can depend upon the reference charge drawn by the ADC ($Q_{REF, ADC}$) and the value of the capacitance of the decoupling capacitor ($C_{EXT}$) as follows:

$$\Delta V_{REF} = \frac{Q_{REF,ADC}}{C_{EXT}} \quad \text{Equation 1}$$

By reducing the average $Q_{REF, ADC}$, a smaller difference in reference value $\Delta V_{REF}$ can be achieved. In addition, a smaller decoupling capacitor $C_{EXT}$ can be cheaper and can occupy less area on the printed circuit board (PCB). As the reference charge consumed in bit-trials is reduced, the ringing of reference voltage due to bond-wire inductance can be reduced. This can help in speeding up bit trials of SAR conversion. Also, reducing the variation of reference current with respect to the input can help relax the reference buffer specifications.

Figure 1:
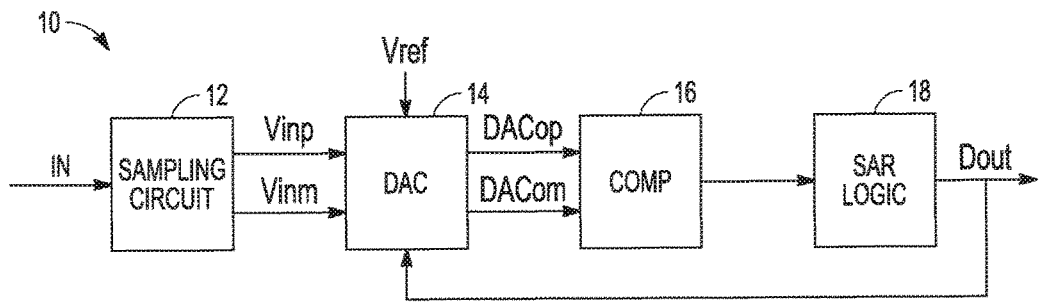
FIG. 1 is a functional block diagram of an example of a system including a successive approximation register (SAR) analog-to-digital converter circuit.

FIG. 1 is a functional block diagram of an example of a system including an ADC 10, e.g., a successive approximation register (SAR) ADC. In the example, a differential analog input voltage is sampled and held using sampling circuit 12, and a differential output voltage of a DAC circuit 14 is compared to the sampled and held voltage using comparator circuit 16. The bit values of the DAC circuit 14 are adjusted based on the output of the comparator circuit 16. The conversion may start with the DAC set to midscale. The comparator 16 determines whether the DAC output is greater or less than the sampled input voltage and the result is stored as a one or zero for that bit of the DAC. Conversion then proceeds to the next hit value until all bits of the digital value are determined. One iteration of changing the DAC output and comparing the voltage to the sampled input can be referred to as a bit trial. SAR control logic circuitry 18 controls the ADC operation during the bit trials. When the bit trials are complete, the digital value of the sampled and held voltage is available at output Dout.

In some example implementations, the DAC circuit 14 can include two switched capacitor DAC (CDAC) arrays, a first CDAC referred to as "P-DAC" and connected to a non-inverting input of the comparator 16, and a second CDAC referred to as "N-DAC" and connected to an inverting input of the comparator 16. Each CDAC includes a plurality of capacitors, each capacitor having first and second plates. Each of the capacitors of the CDAC array has an associated switch that is operable to selectively connect a first plate, e.g., the lowermost or "bottom" plate as shown in FIGS. 2A-2D, to either the first reference voltage Vrefp or to the second reference voltage "Vrefn" depending on the bit trial result. Generally, Vrefn corresponds to ground and Vrefp is positive relative to Vrefn.

In some implementations, the basic SAR algorithm can involve a "Guess->Decide-=>Set" manner in switching bit trial capacitors. Each bit can be "set", e.g., connected to Vrefp, at the start of that particular hit trial, and based on the bit trial output, that bit setting may be kept or "reset", e.g., connected to Vrefn.

Various techniques of this disclosure can make use of previous conversion data to reduce the reference current needed in the present conversion. Doing so can significantly reduce overall reference charge, e.g., reference charge in the conversion phase as well as the acquisition phase, with the overhead being one extra bottom plate latch per bit trial compared to a binary implementation. The bottom plate latch count and the reference charge is less than what can be achieved with conventional binary implementations. These techniques are suitable for a number of ADC structures, including for example, 1) entire ADC, when multiple track and holds (T/Hs) are using a single ADC to convert; 2) all stages of a pipelined ADC except the first stage; and 3) sub-DACs of a first stage of a pipelined ADC with known acquisition time.

As described in detail below with respect to FIGS. 2A-2D, various techniques of this disclosure can keep the result of a conversion on the bottom plates (BP) of the P-DAC/N-DAC (and/or P-subDAC/N-subDAC) until the next acquisition phase starts. For example, the ADC 10 of FIG. 1, e.g., SAR control logic circuitry 18, can form an electrical connection, e.g., by controlling various electronic switches such as transistors, to short the "bottom" plates of corresponding P-DAC/N-DAC capacitors to generate a common-mode voltage in an acquisition phase and keep the switches in the same state until that particular bit-trial occurs. Then, the control circuitry 18 of FIG. 1 can control the switches to remove the short and change the bottom plate connections to reflect the bit-trial result. It should be understood that the term "bottom plate" is meant for conceptual purposes only and may not be physically located below another plate of the capacitor.

Techniques for generating a common mode voltage are described in U.S. patent application Ser. No. 15/227,687, titled "SYSTEMS AND METHODS FOR GENERATING A COMMON MODE COMPENSATION VOLTAGE IN A SAR ADC," to Baozhen Chen et al., and filed on Aug. 3, 2016, the entire contents being incorporated herein by reference. A bottom plate common mode voltage can be generated by shorting the bottom-plates of corresponding P-DAC and N-DAC capacitors that are sampling voltage inputs. In one approach, such shorted capacitors may or may not participate in the bit trials during the conversion (e.g., main-DAC capacitors or T/H capacitors). The bottom plate common-mode voltage generation for a particular conversion is performed during that conversion itself.

Another approach can include generating a bottom plate common mode voltage by shorting the corresponding bottom plates of P-DAC and N-DAC capacitors whose bottom plates are connected to the results of the previous conversion. These capacitors need not sample input (e.g., sub-DAC capacitors or conversion-DAC capacitors). The bottom plate common mode voltage generation for a particular conversion is performed during the corresponding acquisition phase. There is no need to perform any switching on the bottom plates of these capacitors during conversion except for when loading the results of corresponding bit-trials. Care should be used when the acquisition time is long or unknown, as the shorted bottom plates are "floating" in the sense that they are not being actively driven to a specified node voltage, and therefore such floating node voltages may drift over time or be affected by noise.

The operations schematically depicted below in FIGS. 2A-2D can significantly reduce the overall reference charge needed to perform the ADC operations. For example, by utilizing charge present on plates of the bit trial capacitors following a conversion, the overall reference charge needed to perform the ADC operations can be reduced.

The techniques described in this disclosure can be implemented in an integrated circuit device. Reducing the overall charge needed to perform the ADC operations can allow an integrated circuit to operate at reduced power consumption, particularly for battery-powered applications. As described in detail below, the overall reference can be reduced by the following:

The Vrefp/Vrefn connections of the bit trial capacitors of the DACs (or sub-DACs) are maintained from the end of a current conversion to just prior to the beginning of the next acquisition phase.

At the start of the next acquisition phase, the bottom plates of the bit trial capacitors of the P-DAC and N-DAC can be shorted to generate a common mode voltage Vref/2. The common mode voltage Vref/2 can be generated at the bottom plate of the bit trial capacitors because the P-DAC and N-DAC bit trial capacitor bottom plates will be connected to complementary reference voltages no matter the previous conversion result.

As the conversion phase begins, the bottom plates of the sampling capacitors are disconnected from the input voltage and the P-DAC and N-DAC bottom-plates of sampling capacitors are shorted to generate input common-mode voltage. This can be also done by connecting the bottom plates of these sampling capacitors to a known common mode voltage.

As bit trials progress, the shorts between the bottom plates of the P-DAC and N-DAC bit trial capacitors are removed and the bit trial results are applied to the bottom plates of the bit trial capacitors.

FIGS. 2A-2D schematically depict an example portion of an analog-to-digital converter circuit, e.g., SAR ADC 10 of FIG. 1, including portions of a sampling capacitor array and a non-sampling capacitor array. The top half of FIGS. 2A-2D depict the "P" portion of the sampling capacitors and the bit trial capacitors, and the bottom half depicts the "N" portion of the sampling capacitors and the bit trial capacitors. For simplicity, each half of FIGS. 2A-2D depicts one sampling capacitor Cs and two bit trial capacitors, namely 2C and C, that represent two bits (B1, B2 respectively).

The "P" portion depicts a portion of a first digital-to-analog converter circuit (DAC) 103 configured to sample an input voltage, the first DAC circuit having multiple capacitor elements, each element having a first plate and a second plate and corresponding to a digital bit position, and the "N" portion depicts a portion of a second DAC circuit 105 configured to sample the input voltage, the second DAC having multiple elements, each element having a first plate and a second plate and corresponding to a digital bit position.

Figure 2A:
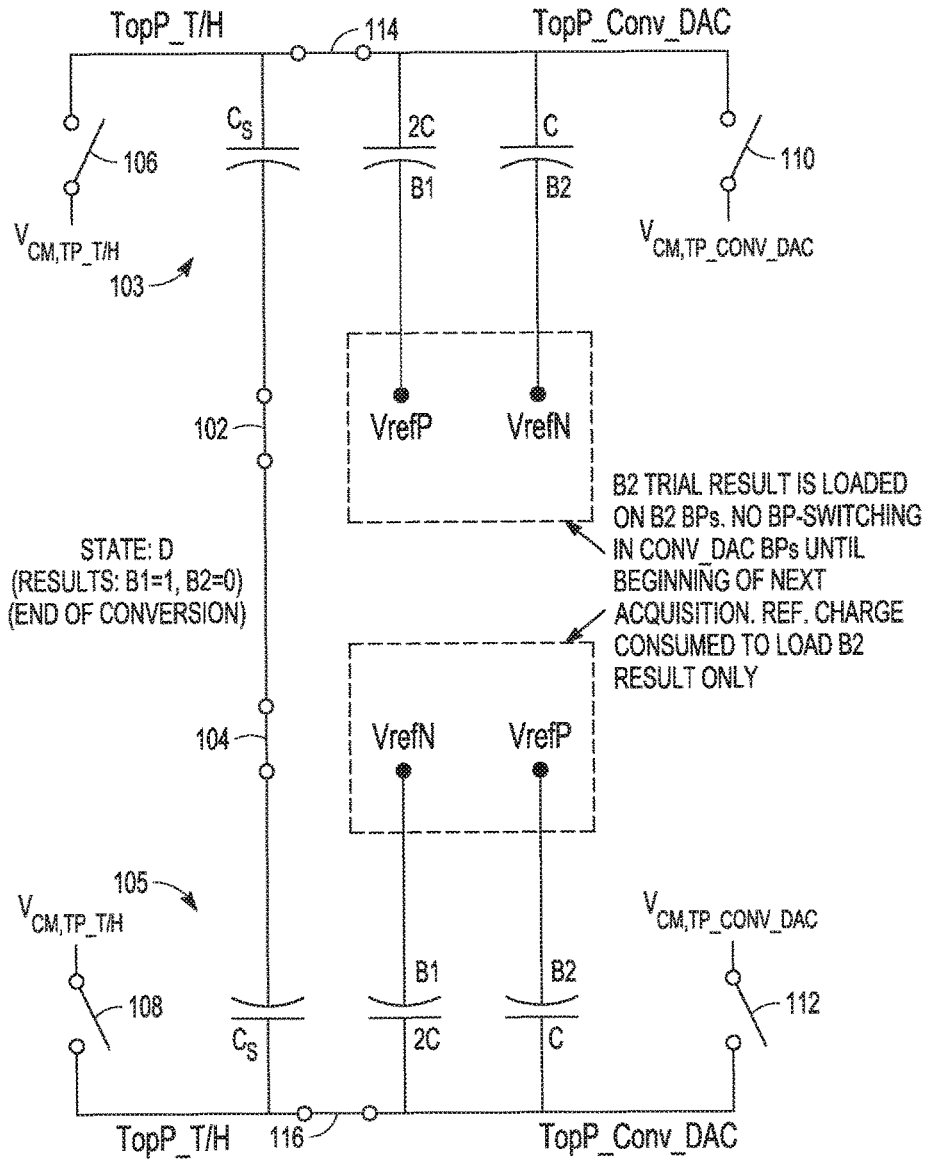
FIGS. 2A-2D schematically depict an example portion of a sampling capacitor array and a non-sampling capacitor DAC array.

FIG. 2A represents the state of the sampling capacitor Cs and the bit trial capacitors just following a conversion phase. In FIG. 2A, all of the bit trial results are available (e.g., B1=1 and B2=0), and have been loaded onto the bottom plates (BP) of the respective capacitors 2C, C. In particular, the control circuitry 18 of FIG. 1 has loaded the B1 bit trial result onto the bottom plates of the 2C capacitors by controlling one or more electronic switches to connect the bottom plate of the P-DAC bit trial capacitor 2C connected to Vrefp and the bottom plate of the N-DAC bit trial capacitor 2C is connected to Vrefn. The control circuitry 18 of FIG. 1 previously loaded the B1 bit trial result, as described with respect to FIG. 2D.

The control circuitry 18 of FIG. 1 connects the bottom plates of the sampling capacitors to the bottom plate common mode voltage, e.g., by shorting or closing electronic switches 102, 104, and the sampling capacitors are ready for the next acquisition. The control circuitry 18 of FIG. 1 has opened the common mode top plate PH switches 106, 108, and opened the top plate conversion DAC switches 110, 112. Top plate switches 114, 116 are closed.

Figure 2B:
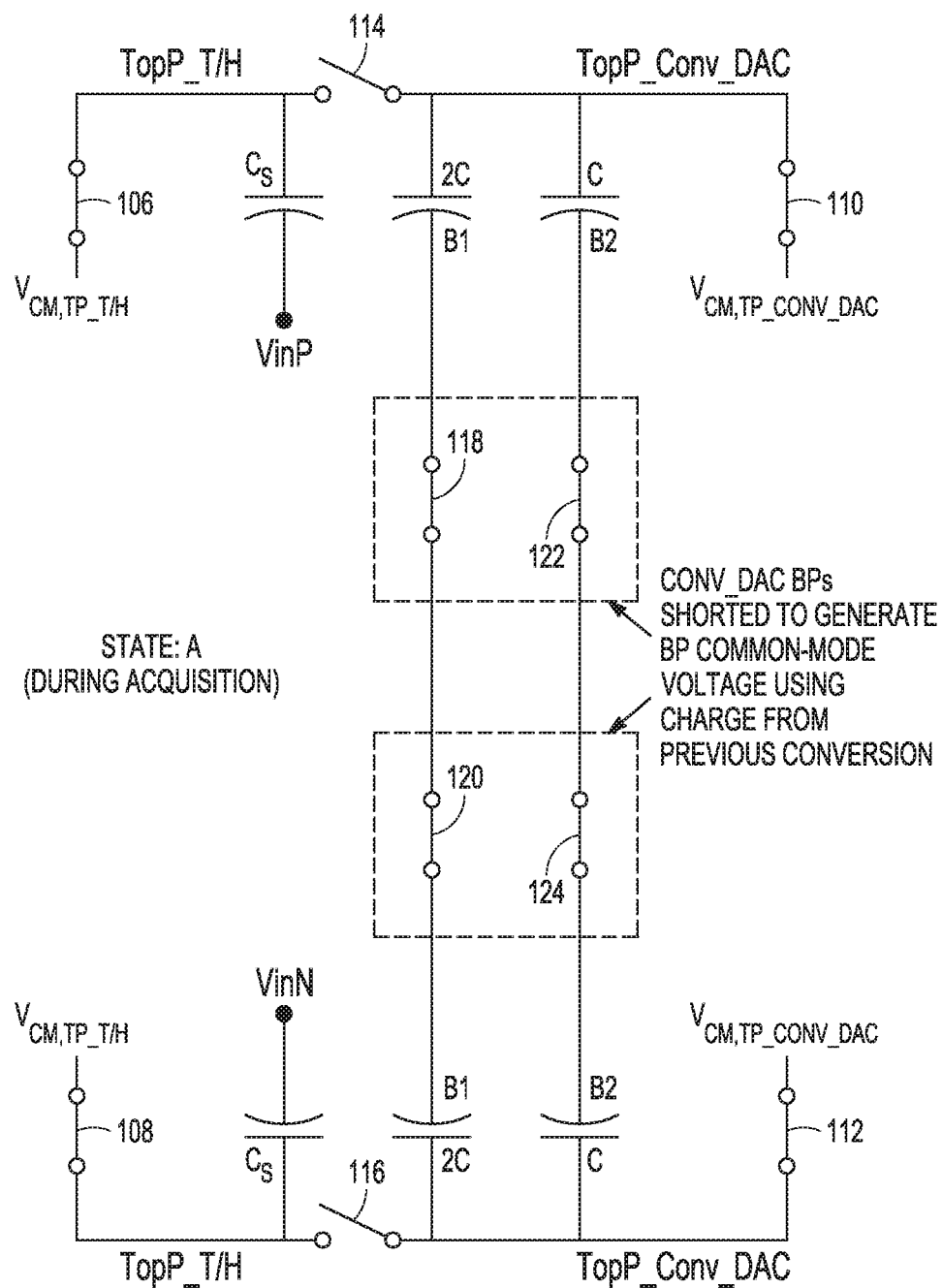

FIG. 2B represents the state of the sampling capacitor Cs and the bit trial capacitors during an acquisition phase. The bottom plate of the "P" sampling capacitor Cs is connected to positive input voltage VinP and the bottom plate of the "N" sampling capacitor Cs is connected to negative input voltage VinN, respectively. The common mode top plate T/H switches 106, 108 are closed, and the top plate conversion DAC switches 110, 112 are closed. Top plate switches 114, 116 are open.

While the sampling capacitors Cs are sampling the input, the control circuitry 18 connects the bottom plates of the bit trial capacitors 2C, C to the common mode voltage. Here, the common mode voltage is generated by the control circuitry 18 of FIG. 1 shorting the P-DAC bottom plates to the N-DAC bottom plates via switches 118-124. Although shown just for two capacitors, the control circuitry 18 of FIG. 1 can short all the bottom plates of the capacitors in the conversion DAC together to generate the bottom plate common mode voltage.

Generally, a SAR ADC will reset the bottom plates of the bit trial capacitors after the conversion phase. In contrast, various techniques of this disclosure avoid such a reset. In previous FIG. 2A, which shows the results after the conversion phase, the settings for the bottom plates of the P-DAC and the settings for the bottom plates of the N-DAC are complementary. For example, the bottom plate of the P-DAC bit trial capacitor 2C is connected to Vrefp and the bottom plate of the N-DAC bit trial capacitor 2C is connected to Vrefn.

The present inventors have determined that the bottom plates of the P-DAC and N-DAC bit trial capacitors 2C, C can be shorted to generate a bottom plate common mode voltage, which can utilize the charge from the previous conversion (which was complementary). The results from the conversion are kept until a command is received to perform the next acquisition. When the next acquisition command is received, the bottom plates of the respective bit trial capacitors in the P-DAC and N-DAC are shorted together. At the start of the acquisition phase, e.g., in FIG. 2B, shorting the bottom plates of the P-DAC and N-DAC can generate Vref/2. In this manner, the energy consumed for the conversion phase can be used during next acquisition phase.

In another example implementation, the acquisition phase can include two stages. The first stage is described above with respect to FIG. 2B in which, at the start of acquisition phase, the bottom plates of the P-DAC and N-DAC bit trial capacitors 2C, C can be shorted to generate a bottom plate common mode voltage. In such an implementation, the shorting can be a momentary short prior to acquisition. This can result in removing input dependent component in the reference current during the acquisition phase of the ADC.

Then, in a second stage of the acquisition phase, the control circuit 18 of FIG. 1 can connect the bottom plates of the P-DAC and N-DAC bit trial capacitors 2C, C to different sampling voltages, if required. At the start of the start of the conversion phase (FIG. 2C), the control circuit 18 can disconnect the bottom plates of the P-DAC and N-DAC bit trial capacitors 2C, C from these sampling voltages and then the control circuit 18 can perform bit trials in a normal binary SAR operation.

Figure 2C:
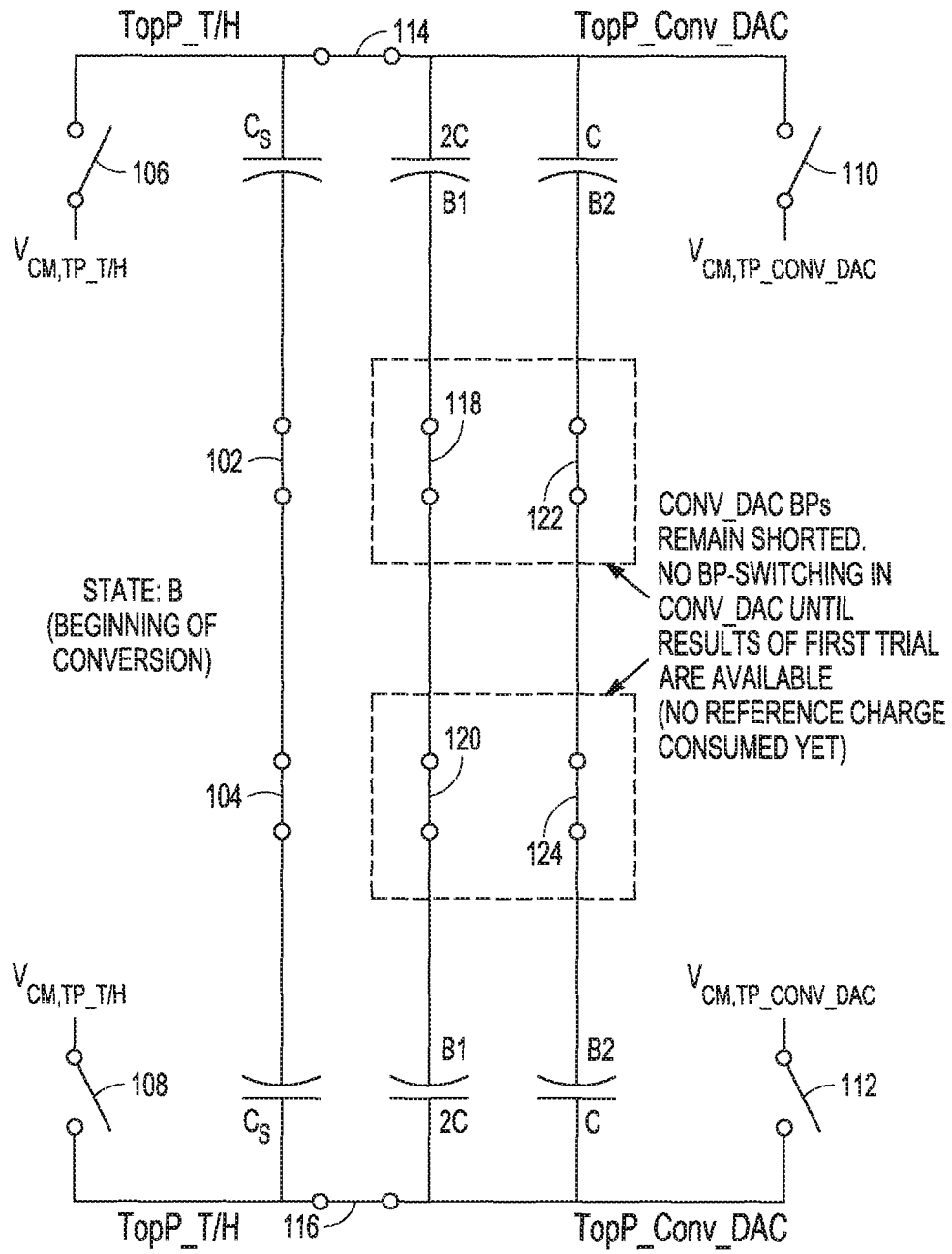

FIG. 2C represents the state of the sampling capacitor Cs and the bit trial capacitors just prior to a conversion phase. In FIG. 2C, the common mode top plate T/H switches 106, 108 are open, and the top plate conversion DAC switches 110, 112 are open. Top plate switches 114, 116 are closed.

In addition, the bottom plates of the P-DAC and N-DAC sampling capacitors Cs are connected to a bottom plate common mode voltage, e.g., shorted via switches 102, 104. There are other techniques to generate a common mode voltage, including for example, connecting the bottom plates of the P-DAC and N-DAC sampling capacitors Cs to a common mode voltage. By connecting the bottom plates of the DACs to a common mode voltage, the top plates have the information input and the comparator can compare without any extra switching on the bit trial capacitors.

Using the techniques of this disclosure, no switching is needed onto the bottom plates of the bit trial capacitors between the end of the acquisition phase and the beginning of the conversion phase, and no additional reference current is needed. As such, bit trials can begin immediately.

Figure 2D:
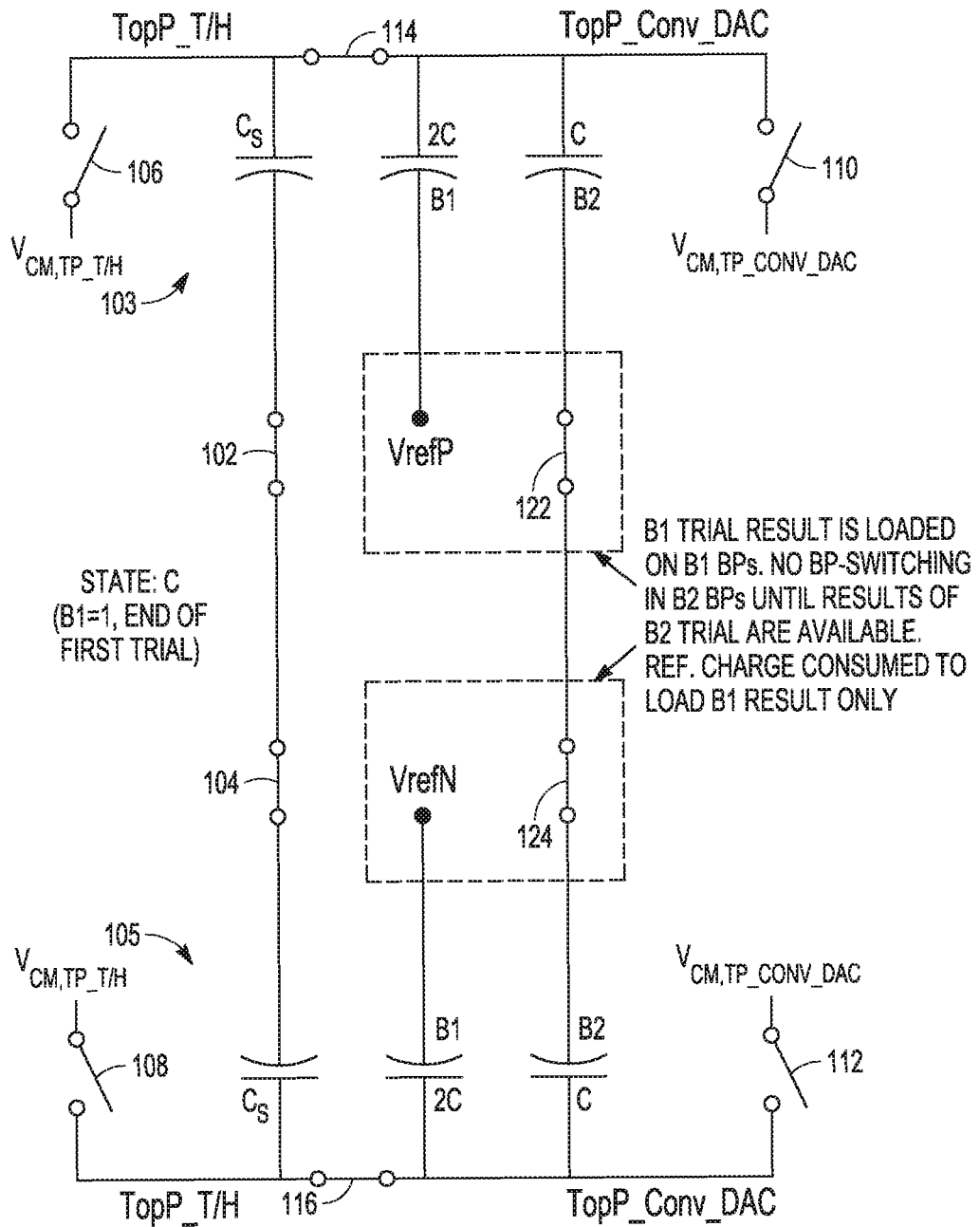

FIG. 2D represents the state of the sampling capacitor Cs and the bit trial capacitors at the end of the first trial. The common mode top plate switches 106, 108 are open, and the top plate conversion DAC switches 110, 112 are open. Top plate switches 114, 116 are closed. The bottom plates of the P-DAC and N-DAC sampling capacitors Cs are connected to a bottom plate common mode voltage, e.g., shorted via switches 102, 104.

In FIG. 2D, the ADC performs a bit trial on the capacitor 2C and determines that B1, represented by bit trial capacitor 2C, is a "1". The ADC loads the B1 result ("1") onto the bottom plates of each of the P-DAC and N-DAC capacitors 2C. In particular, the ADC connects the bottom plate of capacitor 2C of the P-DAC to Vrefp and the ADC connects the bottom plate of capacitor 2C of the N-DAC to Vrefn. Reference charge is consumed to load the B1 result at this point. There is no bottom plate switching of the bit trial capacitor C until the results of the B2 trial are available.

Referring again to FIG. 2A, the ADC performs a bit trial on the capacitor C and determines that B2, represented by bit trial capacitor C, is a "0". The ADC loads the B2 result ("0") onto the bottom plates of each of the P-DAC and N-DAC capacitors C. In particular, the ADC connects the bottom plate of capacitor C of the P-DAC to Vrefn and the ADC connects the bottom plate of capacitor C of the N-DAC to Vrefp. Reference charge is consumed to load the B2 result at this point.

If the conversion was finished and a new acquisition has not started yet, the bottom plates of the bit trial capacitors 2C, C can remain connected to their Vrefp/Vrefn depending on their bit trial result. As soon as acquisition phase starts, the bottom plates of the bit trial capacitors can be shorted to generate common mode voltage.

The reference charge savings from the techniques shown in FIGS. 2A-2D can occur because the DAC does not draw any charge from the reference during the first bit trial. As soon as the sampling charge is dumped, the DAC is ready for the first bit trial, without any further switching needed. In addition, the DAC does not draw any charge from the reference during the acquisition phase.

The switching scheme proposed above can have a number of advantages. For example, each bit trial capacitor does not have to be split into two halves like in other techniques. This can allow for the use of larger unit capacitors, which can eventually lead to lower areas. In addition, the bottom plate latch count of the proposed implementation is less than the bottom plate latch count needed to implement other techniques. Also, the reference charge drawn in the acquisition is zero. The reference charge drawn during the bit trials can be significantly lower than conventional binary implementations.

Various techniques of this disclosure are also applicable to implementations in which the DAC is split into at least a main DAC having a plurality of sampling capacitors and a sub-DAC having a plurality of bit trial capacitors (and sub-sub-DACs), where the main DAC and the sub-DAC are joined via a coupling capacitor. Referring to FIGS. 2A-2D, such an implementation can be achieved by replacing top plate switches 114, 116 with a coupling capacitor (not depicted), which can be used for charge scaling.

Figure 3:
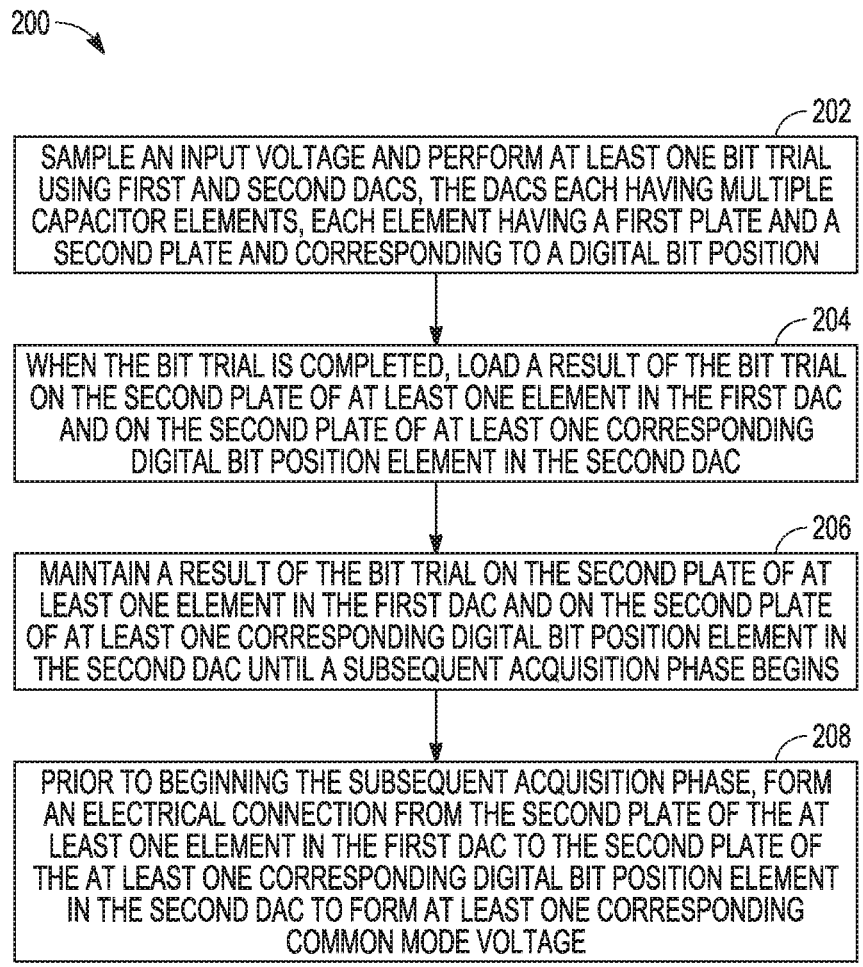
FIG. 3 is a flow diagram representing an example of a method of operating a SAR analog to digital converter (ADC) integrated circuit device.

FIG. 3 is a flow diagram representing an example of a method 200 of operating an analog-to-digital converter (ADC) circuit for reducing an amount of reference charge drawn during operation. At block 202, the method 200 can include an ADC circuit, e.g., sampling an input voltage onto one or more sampling capacitors, and performing, e.g., using control circuitry 18 of FIG. 1, one or more bit trials using first and second DACs, e.g., P-DAC 103 and N-DAC 105 of FIG. 2A, the first and second DACs each having multiple capacitor elements, each element having a first plate and a second plate and corresponding to a digital bit position. At block 204, when the hit trial(s) is completed, the method 200 can include loading, e.g., using control circuitry 18 of FIG. 1, a result of the at least one bit trial on the second plate of at least one element in the first DAC and on the second plate of at least one corresponding digital bit position element in the second DAC.

At block 206, the method 200 can include maintaining, e.g., using control circuity 18 of FIG. 1, a result of the bit trial(s) on the second plate of at least one element in the first DAC and on the second plate of at least one corresponding digital bit position element in the second. DAC until a subsequent acquisition phase begins. At block 208, the method 200 can include, prior to beginning the subsequent acquisition phase, forming an electrical connection, e.g., using control circuitry 18 of FIG. 1, from the second plate of the at least one element in the first DAC to the second plate of the at least one corresponding digital bit position element in the second DAC to form at least one corresponding common mode voltage having a value of an average of a voltage on the second plate of the at least one element in the first DAC and a voltage on the second plate of the at least one corresponding digital bit position element in the second DAC.

In some aspects, the method 200 can optionally include prior to a conversion phase, forming an electrical connection from the second plate of the at least one sampling capacitor in the first DAC to the second plate of the at least one corresponding sampling capacitor in the second DAC.

In some aspects, forming an electrical connection from the second plate of the at least one element in the first DAC to the second plate of the at least one corresponding digital bit position element in the second DAC to form at least one common mode voltage having a value of an average of a voltage on the second plate of the at least one element in the first DAC and a voltage on the second plate of the at least one corresponding digital bit position element in the second DAC can optionally include during a bit trial phase, using reference charge stored on the second plate of the at least one element in the first DAC and on the second plate of the at least one corresponding digital bit position element in the second DAC from a previous conversion.

In some aspects, the method 200 can optionally include during a bit trial phase, electrically disconnecting the second plate of the at least one element in the first DAC from the second plate of the at least one corresponding digital bit position element in the second DAC.

In some aspects, the method 200 can optionally include prior to beginning the acquisition phase, electrically disconnecting the second plate of the at least one sampling capacitor in the first DAC from the second plate of the at least one corresponding sampling capacitor in the second DAC.

In some aspects, performing at least one bit trial using first and second digital-to-analog converters (DACs) can optionally include performing a plurality of bit trials as part of a successive approximation conversion routine.

In some aspects, forming an electrical connection can optionally include controlling at least one electronic switch to connect the second plate of the at least one element in the first DAC to the second plate of the at least one corresponding digital bit position element in the second DAC.

In some aspects, the voltage on the second plate of the at least one element in the first DAC is a first reference voltage, and the voltage on the second plate of the at least one corresponding digital bit position element in the second DAC is a complementary second reference voltage.

Various Notes

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A method of operating an analog-to-digital converter (ADC) integrated circuit device for reducing an amount of reference current drawn during operation by using a result of a previous conversion to reduce the reference current in a current conversion, the method comprising:
   prior to beginning an acquisition phase, forming an isolated electrical connection from a plate of at least one capacitor element in a first digital-to-analog converter circuit (DAC) to a plate of the at least one corresponding digital bit position capacitor element in a second DAC to form at least one corresponding common mode voltage; and
   acquiring an input voltage onto the first and second DACs.

2. The method of claim 1, further comprising:
   prior to a conversion phase, forming an electrical connection from the plate of at least one sampling capacitor in the first DAC to the plate of at least one corresponding sampling capacitor in the second DAC, and
   performing a plurality of bit trials as part of a successive approximation conversion routine.

3. The method of claim 1, wherein forming the isolated electrical connection from the plate of the at least one element in the first DAC to the plate of the at least one corresponding digital bit position element in the second DAC to form at least one common mode voltage includes:
   during a bit trial phase, using reference charge stored on the plate of the at least one element in the first DAC and on the plate of the at least one corresponding digital bit position element in the second DAC from a previous conversion.

4. The method of claim 1, further comprising:
   during a bit trial phase, electrically disconnecting the plate of the at least one element in the first DAC from the plate of the at least one corresponding digital bit position element in the second DAC.

5. The method of claim 1, further comprising:
   prior to beginning the acquisition phase, electrically disconnecting the plate of the at least one sampling capacitor in the first DAC from the plate of the at least one corresponding sampling capacitor in the second DAC.

6. The method of claim 1, comprising:
   prior to a conversion phase, removing the electrical connection from the plate of the at least one element in the first DAC to the plate of the at least one corresponding digital bit position element in the second DAC and forming an electrical connection between the plate of the at least one element in the first DAC and a sampling voltage and forming an electrical connection between the plate of at least one element in the second DAC and another sampling voltage.

7. The method of claim 1, wherein forming an electrical connection includes:
   controlling at least one electronic switch to connect the plate of the at least one element in the first DAC to the plate of the at least one corresponding digital bit position element in the second DAC.

8. The method of claim 1, wherein a voltage on the plate of the at least one element in the first DAC is a first reference voltage, wherein a voltage on the plate of the at least one corresponding digital bit position element in the second DAC is a complementary second reference voltage.

9. The method of claim 1, further comprising:
   performing at least one bit trial using the first and second DACs;
   when the at least one bit trial is completed, loading a result of the at least one bit trial on the plate of the at least one capacitor element in the first DAC and on the plate of the at least one corresponding capacitor element in the second DAC; and
   maintaining the result until a subsequent acquisition phase begins.

10. An analog-to-digital converter (ADC) circuit for reducing an amount of reference current drawn during operation by using a result of a previous conversion to reduce the reference current in a current conversion, the circuit comprising:
    a first digital-to-analog converter circuit (DAC) configured to sample an input voltage, the first DAC circuit having multiple capacitor elements, each element having a first plate and a plate and corresponding to a digital bit position;
    a second DAC circuit configured to sample the input voltage, the second DAC circuit having multiple elements, each element having a first plate and a plate and corresponding to a digital bit position; and
    control circuitry configured to:
      prior to beginning an acquisition phase, form an isolated electrical connection from the second plate of the at least one element in the first DAC to the second plate of the at least one corresponding digital bit position element in the second DAC to form at least one corresponding common mode voltage; and
      acquiring an input voltage onto the first and second DACs.

11. The circuit of claim 10, wherein the control circuitry is further configured to:
    prior to a conversion phase, form an electrical connection from the plate of the at least one sampling capacitor in the first DAC to the plate of the at least one corresponding sampling capacitor in the second DAC; and
    perform a plurality of bit trials as part of a successive approximation conversion routine.

12. The circuit of claim 10, wherein the control circuitry configured to form the isolated electrical connection from the plate of the at least one element in the first DAC to the plate of the at least one corresponding digital bit position element in the second DAC to form at least one common mode voltage is configured to:
during a bit trial phase, using reference charge stored on the second plate of the at least one element in the first DAC and on the second plate of the at least one corresponding digital bit position element in the second DAC from a previous conversion.

13. The circuit of claim 10, wherein the control circuitry is further configured to:
during a bit trial phase, electrically disconnect the second plate of the at least one element in the first DAC from the second plate of the at least one corresponding digital bit position element in the second DAC.

14. The circuit of claim 10, wherein the control circuitry is further configured to:
prior to beginning the acquisition phase, electrically disconnect the second plate of the at least one sampling capacitor in the first DAC from the second plate of the at least one corresponding sampling capacitor in the second DAC.

15. The circuit of claim 10, wherein the control circuitry is further configured to:
prior to a conversion phase, remove the electrical connection from the second plate of the at least one element in the first DAC to the second plate of the at least one corresponding digital bit position element in the second DAC and form an electrical connection between the second plate of the at least one element in the first DAC and a sampling voltage and forming an electrical connection between the second plate of at least one element in the second DAC and another sampling voltage.

16. The circuit of claim 10, wherein the control circuitry configured to form an electrical connection is configured to:
control at least one electronic switch to connect the second plate of the at least one element in the first DAC to the second plate of the at least one corresponding digital bit position element in the second DAC.

17. The circuit of claim 10, wherein a voltage on the second plate of the at least one element in the first DAC is a first reference voltage, wherein a voltage on the second plate of the at least one corresponding digital bit position element in the second DAC is a complementary second reference voltage.

18. The integrated circuit device of claim 10, wherein the control circuitry is further configured to:
perform at least one bit trial using the first and second DACs;
when the at least one bit trial is completed, load a result of the at least one bit trial on the plate of the at least one capacitor element in the first DAC and on the plate of the at least one corresponding capacitor element in the second DAC; and
maintain the result until a subsequent acquisition phase begins.

19. An integrated circuit device for reducing an amount of reference current drawn during operation by using a result of a previous conversion to reduce the reference current in a current conversion the device comprising:
a successive approximation register (SAR) analog-to-digital converter (ADC) circuit for reducing an amount of reference charge drawn during an analog-to-digital conversion, the SAR ADC circuit comprising:
a first digital-to-analog converter circuit (DAC) configured to sample an input voltage, the first DAC circuit having multiple capacitor elements, each element having a first plate and a second plate and corresponding to a digital bit position;
a second DAC circuit configured to sample the input voltage, the second DAC circuit having multiple elements, each element having a first plate and a second plate and corresponding to a digital bit position; and
control circuitry configured to:
perform at least one bit trial using the first and second DACs;
when the at least one bit trial is completed, load a result of the at least one bit trial on the second plate of at least one element in the first DAC and on the second plate of at least one corresponding digital bit position element in the second DAC;
maintain a result of the at least one bit trial on the second plate of at least one element in the first DAC and on the second plate of at least one corresponding digital bit position element in the second DAC until a subsequent acquisition phase begins; and
prior to beginning the subsequent acquisition phase, form an isolated electrical connection from the second plate of the at least one element in the first DAC to the second plate of the at least one corresponding digital bit position element in the second DAC to form at least one corresponding common mode voltage having a value of an average of a voltage on the second plate of the at least one element in the first DAC and a voltage on the second plate of the at least one corresponding digital bit position element in the second DAC.

20. The integrated circuit device of claim 19, wherein the control circuitry is further configured to:
prior to a conversion phase, form an electrical connection from the second plate of the at least one sampling capacitor in the first DAC to the second plate of the at least one corresponding sampling capacitor in the second DAC.

21. The integrated circuit device of claim 19, wherein the control circuitry configured to form an electrical connection from the second plate of the at least one element in the first DAC to the second plate of the at least one corresponding digital bit position element in the second DAC to form at least one common mode voltage having a value of an average of a voltage on the second plate of the at least one element in the first DAC and a voltage on the second plate of the at least one corresponding digital bit position element in the second DAC is configured to:
during a bit trial phase, using reference charge stored on the second plate of the at least one element in the first DAC and on the second plate of the at least one corresponding digital bit position element in the second DAC from a previous conversion.

22. The integrated circuit device of claim 19, wherein the voltage on the second plate of the at least one element in the first DAC is a first reference voltage, wherein the voltage on the second plate of the at least one corresponding digital bit position element in the second DAC is a complementary second reference voltage.

* * * * *

UNITED STATES PATENT AND TRADEMARK OFFICE
CERTIFICATE OF CORRECTION

PATENT NO. : 9,935,648 B1  
APPLICATION NO. : 15/692695  
DATED : April 3, 2018  
INVENTOR(S) : Kamble et al.

Page 1 of 1

It is certified that error appears in the above-identified patent and that said Letters Patent is hereby corrected as shown below:

In the Claims

In Column 11, Line 33, in Claim 1, after "of", delete "the"

In Column 12, Line 20, in Claim 8, after "the", insert --second--

In Column 12, Line 41, in Claim 10, after "a", insert --second--

In Column 12, Line 45, in Claim 10, after "a", insert --second--

In Column 12, Line 59, in Claim 11, after "the", insert --second--

In Column 12, Line 60, in Claim 11, after "the", insert --second--

In Column 12, Line 66, in Claim 12, after "the", insert --second--

In Column 12, Line 66, in Claim 12, after "the", insert --second--

In Column 13, Line 59, in Claim 19, after "conversion", insert --,--

Signed and Sealed this  
Twenty-fifth Day of June, 2019

Andrei Iancu  
*Director of the United States Patent and Trademark Office*